(12) United States Patent
Izumi

(10) Patent No.: US 7,651,877 B2
(45) Date of Patent: Jan. 26, 2010

(54) TWO-DIMENSIONAL IMAGE DETECTING APPARATUS AND METHOD FOR MANUFACTURING THE SAME

(75) Inventor: Yoshihiro Izumi, Kashihara (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 344 days.

(21) Appl. No.: 11/666,008

(22) PCT Filed: Oct. 18, 2005

(86) PCT No.: PCT/JP2005/019084

§ 371 (c)(1), (2), (4) Date: Apr. 23, 2007

(87) PCT Pub. No.: WO2006/046434

PCT Pub. Date: May 4, 2006

(65) Prior Publication Data

US 2008/0099869 A1 May 1, 2008

(30) Foreign Application Priority Data

Oct. 28, 2004 (JP) .............................. 2004-314373

(51) Int. Cl.
*H01L 21/00* (2006.01)
(52) U.S. Cl. .............................. 438/24; 438/25; 438/33; 438/113; 257/E31.101
(58) Field of Classification Search ............. 438/23–27, 438/33, 106–116; 257/E31.101
See application file for complete search history.

(56) References Cited

U.S. PATENT DOCUMENTS 6,559,451 B1  5/2003  Izumi et al.
6,638,782 B2  10/2003  Izumi et al.
6,649,438 B2  11/2003  Izumi et al.
2007/0019132 A1* 1/2007  Kim et al. ..................... 349/95

FOREIGN PATENT DOCUMENTS

| JP | 2000-22120 | 1/2000 |
| JP | 2001-148475 | 5/2001 |
| JP | 2002-314056 | 10/2002 |
| JP | 2003-17673 | 1/2003 |

OTHER PUBLICATIONS

International Search Report of PCT/JP2005/019084, mailed Jan. 24, 2006.
Partial English translation of JP 2002-314056, which was published Oct. 2002.
Partial English translation of JP 2003-17673, which was published Jan. 2003.

* cited by examiner

*Primary Examiner*—H. Jey Tsai
(74) *Attorney, Agent, or Firm*—Nixon & Vanderhye, P.C.

(57) ABSTRACT

The present invention provides a two-dimensional image detecting apparatus including a mold structure which apparatus can be applied to mammography, and a manufacturing method thereof. The manufacturing method includes: a conversion layer formation step of forming a conversion layer (3) on an active matrix substrate (2); a counter substrate formation step of disposing a spacer material (5) and disposing the counter substrate (6) so as to be opposite to the active matrix substrate (2) via the spacer material (5); a mold resin layer formation step of forming a mold structure layer (8) in a space surrounded by the conversion layer (3), the spacer material (5), and the counter substrate (6); and a cutting step of cutting at least the active matrix substrate (2) so that cut surfaces of the constituent members are flush with each other; and a sealing step of securing a sealing material (7) to the cut surface.

8 Claims, 10 Drawing Sheets

F I G. 1
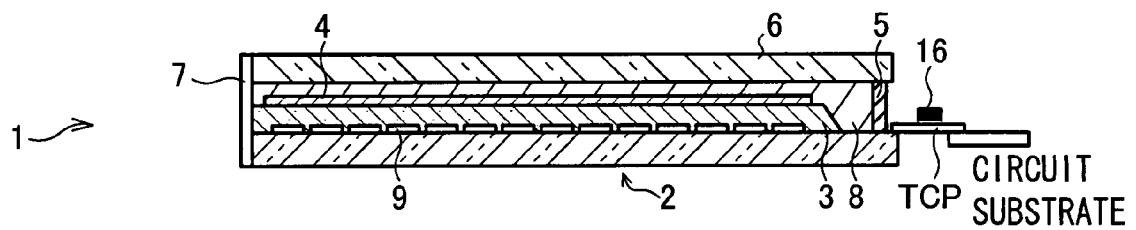

TWO-DIMENSIONAL IMAGE DETECTING APPARATUS AND METHOD FOR MANUFACTURING THE SAME

This application is the US national phase of international application PCT/JP2005/019084, filed 18 Oct. 2005, which designated the U.S. and claims priority of 2004-314373, filed 28 Oct. 2004, the entire contents of each of which are hereby incorporated by reference.

TECHNICAL FIELD

The present invention relates to two-dimensional image detecting apparatuses and a method for manufacturing the same. More specifically, the present invention relates to two-dimensional image detecting apparatuses which include a mold structure and are applicable to mammography, and a method for manufacturing the same.

BACKGROUND ART

Conventional examples of X-ray image taking means in the field of medical diagnosis include: an image detecting apparatus which operates in a S/F (Screen/Film) scheme using an intensifying screen and a film; an image detecting apparatus which operates in a CR (Computed Radiography) scheme in which a latent image recorded on an imaging plate is read by laser scanning; and an image detecting apparatus which operates in. I.I.-TV (Image Intensifier TV) with a combination use of a photomultiplier and a CCD. However, in recent years, flat-panel digital radiation detecting apparatuses have been increasingly developed and commercialized as new image detecting apparatuses, which are alternatives to the above image detecting apparatuses. The flat-panel radiation detecting apparatuses have, as a key device, a flat sensor panel including (a) a thin-film transistor (TFT) array arranged in two dimension and (b) a conversion film (element) which converts X-rays into electrical signals. The flat-panel radiation detecting apparatuses have various advantages as compared with the conventional X-ray image detecting apparatuses. Specifically, the flat-panel radiation detecting apparatuses realize a filmless structure and facilitates image quality improvement and diagnosis support with digital image processing, electronic filing, and networking, as compared with the conventional image detecting apparatuses which operate in the S/F scheme. Further, the flat-panel radiation detecting apparatuses are capable of converting an image detection result into image signals in an instant, as compared with the conventional image detecting apparatuses which operate in the CR scheme. Still further, the flat-panel radiation detecting apparatuses realize extensive sliming down and provides large X-ray images with high resolution, as compared with the conventional image detecting apparatuses which operate in the I.I.-TV scheme.

The flat-panel radiation detecting apparatuses are broadly classified into apparatuses which operate in a "indirect conversion scheme" and apparatuses which operate in a "direct conversion scheme" in terms of difference in X-ray detection principle. The "indirect conversion scheme" is a scheme in which X-ray information is converted into light by means of fluorescent material (Scintillator), and the light is then converted into electrical signals image to obtain image information.

Meanwhile, the "direct conversion scheme" is a scheme in which X-ray information is directly converted into electrical signals by means of an X-ray conversion film (X-ray photoconductor) to obtain image information. When the "indirect conversion scheme" and "the direct conversion scheme" are compared, the "direct conversion scheme", which is not affected by light scattering because it does not include the process for converting X-ray information into light, is able to provide image information with high resolution. Thus, it can be said that the "direct conversion scheme" is suitable for radiation detecting apparatuses which are demanded for high resolution.

FIG. 13 is a plan view schematically illustrating the structure of a sensor panel (including peripheral circuit substrates 113) adopted in the conventional radiation detecting apparatus 100 in the "direct conversion scheme". FIG. 14 is a cross-sectional view of the radiation detecting apparatus 100, taken from a F-F' line of FIG. 13. In FIG. 14, the active matrix substrate (thin-film transistor array) 102 has a plurality of pixel electrodes 101, serving as electric charge collectors, on its surface. On the active matrix substrate 102, a conversion layer 103 (semiconductor film made of Selenium or the like) and an upper electrode 104 are provided in sequence. The conversion layer 103 converts X-rays into electric charges. On the active matrix substrate 102, latticed electrical wiring (not shown) in an XY matrix is formed. For each segment of the latticed electrical wiring, a thin-film transistor (TFT; not shown) and an electric charge storage capacitance (not shown) are formed, connected to the pixel electrode 101.

Next, the following description will discuss a mold structure 105, which is formed so as to cover the conversion layer 103 and the upper electrode 104. In FIGS. 13 and 14, a counter substrate 106 is provided so as to protect the conversion layer 103 and the upper electrode 104 in sequence on the active matrix substrate 102. The counter substrate 106 is provided so as to form a gap between the counter substrate 106 and the upper electrode 104 by means of a sealing material (mold material) 107, which is provided around the perimeter of the counter substrate 106. The gap is filled with a mold resin (mold structure 105). The mold structure 105 provided in this manner makes it possible to protect the conversion layer 103 and the upper electrode 104 from moisture (water), dust, and the like, and makes it possible to prevent electric charge caused by a high voltage applied to the upper electrode 104. Patent Document 1 (Japanese Unexamined Patent Publication No. 148475/2001 (Tokukai 2001-148475); published on May 29, 2001) discloses a two-dimensional image detector including a mold structure.

Incidentally, as discussed previously, the flat-panel radiation detecting apparatuses in the "direct conversion scheme" are suitable for applications that require high resolution. As such, expectations have been placed on their applications to mammography.

In mammography (X-ray photography only for breasts), a subject (i.e. breast) must be brought intimate contact with a photographing side of a photographing apparatus to photograph the subject.

Mammography with a general photographing apparatus had the problem that a part of the subject lies off the edge of the image. This was caused by a distance between an effective photographing area and the edge of the photographing apparatus.

Now, the following description will discuss mammography using a general photographing apparatus with reference to FIG. 15.

FIG. 15 is a cross-sectional view schematically illustrating a relation a general photographing apparatus 110 (e.g. radiation detecting apparatus 100 of FIG. 13) and a subject 120. Examples of the subject 120 include breasts, objects protruded through a base plane H, and objects that cannot be physically separated from the base plane H. FIG. 15 assumes that the subject 120 is a round object that cannot be physically separated from the base plane H. Note that the base plane H is inviolable, so that it is impossible for the photographing apparatus 110 to enter into the base plane H.

As illustrated in FIG. 15, an X-ray image of the whole of the subject 120 cannot be obtained in the photographing apparatus 110 because part of the subject lies off an image detection area A. The image detection area A corresponds to an area where pixel electrodes are arranged.

Radiation detecting apparatuses which can be used in mammography are disclosed in Patent Document 2 (Japanese Unexamined Patent Publication No. 314056/2002 (Tokukai 2002-314056); published on Oct. 25, 2002) and Patent Document 3 (Japanese Unexamined Patent Publication No. 17673/2003 (Tokukai 2003-17673); published on Jan. 17, 2003), for example. In the techniques disclosed in Patent Documents 2 and 3, at least one end of an outer region of a photographing apparatus (image detecting apparatus and irradiation image detecting apparatus), i.e. ends of the apparatus is arranged so as to be very close to an image detection area on a photographing side of the apparatus. In photographing the subject 120, for example, this arrangement does not cause the problem that a part of the subject is not photographed, and makes it possible to excellently carry out photographing. As such, such a photographing apparatus is suitable for mammography.

However, unlike techniques disclosed in Patent Documents 2 and 3 discussed above, a two-dimensional image detector having a structure as shown in FIGS. 13 and 14, disclosed in Patent Document 1, includes gate drivers (LSIs) 111 and signal reading amplifiers (LSIs) 112 in the whole of a non-detection area (area that is not capable of image detection, provided around the image detection area) of the active matrix substrate 102.

Even in a case where the gate drivers (LSIs) 111 and the signal reading amplifiers (LSIs) 112 are moved to another place to have an area where no LSIs are disposed at one portion of the non-detection area, the following problem arises.

That is, in a two-dimensional image detector disclosed in Patent Document 1, a sealing material (corresponding to sealing material 107 in FIG. 14), which is disposed so as to surround an X-ray conductive layer (corresponding to the conversion layer 103 in FIG. 14) is used in forming a mold structure. The sealing material serves to ensure a gap between an active matrix substrate and a counter substrate and to secure the active matrix substrate and the counter substrate by bonding. In such a case, contact or overlap between the sealing material and a part of the X-ray conductive layer is not preferable in view of securing of bonding between the sealing material and the active matrix substrate. In manufacturing, the sealing material is therefore disposed so as to be some distance from the X-ray conductive layer. As a result, to provide a mold structure, the X-ray conductive layer and the sealing material are inevitably apart from each other at a predetermined distance.

For this reason, even a two-dimensional image detector which brings the above beneficial effect with the adoption of a mold structure, is difficult to be applied to mammography.

The present invention has been attained in view of the above problems, and an object of the present invention is to provide a two-dimensional image detecting apparatus which includes a mold structure and is applicable to mammography. Additionally, an object of the present invention is to provide a method for manufacturing a two-dimensional image detecting apparatus, including a step of processing a two-dimensional image detecting apparatus having a mold structure formed therein so as to be applicable to mammography.

DISCLOSURE OF INVENTION

In order to solve the above problems, a method for manufacturing a two-dimensional image detecting apparatus of the present invention includes: a conversion layer formation step of forming a conversion layer on a substrate, which has an image detection area and a non-detection area, so that at least the image detection area is covered with the conversion layer, the image detection area having active elements arranged therein, the non-detection area having no active elements arranged therein, the conversion layer converting incident electromagnetic waves into electric charges; a counter substrate disposing step of disposing a spacer material on the non-detection area around the conversion layer, and disposing a counter substrate so as to be opposite to the substrate via the spacer material; a mold structure formation step of forming a mold structure in an area surrounded by the conversion layer, the spacer material, and the counter substrate; a cutting step of, after the mold structure forming step, cutting the substrate and the counter substrate so that respective cut surfaces thereof are flush with each other in a portion of the non-detection area; and a sealing step of securing a sealing member to the respective cut surfaces. Specifically, it is preferable that the substrate is of rectangular shape and has the image detection area in its center section and the non-detection area around the image detection area, and the substrate is cut at its one end in the cutting step.

With the above arrangement, a two-dimensional image detecting apparatus manufactured by the manufacturing method of the present invention is such that the non-detection area of the substrate is cut in the cutting step. Accordingly, even if the two-dimensional image detecting apparatus has a mold structure, it is possible to cut off a portion of the non-detection area so that the image detection area and an outer edge of the two-dimensional image detecting apparatus are come close to each other.

More specifically, a non-detection area which is provided on at least one end of four ends of the substrate that is of quadrangular shape and has the non-detection area on the outer region of a surface of the substrate is cut in the cutting step. This makes it possible to bring the outer edge of the two-dimensional image detecting apparatus and the image detection area close to each other at the one end which has been cut. As such, the two-dimensional image detecting apparatus, even if having a mold structure, is applicable to mammography.

As described previously, in a two-dimensional image detecting apparatus having a mold structure, it is necessary to dispose a spacer material so that a mold structure is formed. Accordingly, the image detection area and the spacer material are inevitably at a predetermined distance from each other. When the image detection area and the spacer material remain apart from each other, there exists an area (non-detection area) where an image of a subject cannot be detected, between the outer edge of the two-dimensional image detecting apparatus and the image detection area having active elements. This arrangement interferes with its application to mammography. On the contrary, in a two-dimensional image detecting apparatus manufactured by the manufacturing method of the present invention, at least the substrate and the counter substrate are cut in the non-detection area of the substrate. As such, the outer edge of the two-dimensional image detecting apparatus and the image detection area can be close to each other at a portion of the two-dimensional image detector, more specifically, at least one end of the quadrangular substrate.

Therefore, even when a two-dimensional image detecting apparatus manufactured by the manufacturing method of the present invention is applied to mammography, it is possible to detect an entirety of a subject or practically detect an entirety of a subject, thus realizing an excellent mammography.

Since the cut surfaces formed by the cutting step are sealed with a sealing member, it is possible to reliably prevent the intrusion of moisture and impurity ion from the cut surfaces. This makes it possible to ensure a sufficient reliability of the two-dimensional image detecting apparatus even if a cutting spot is very close to the effective area.

Further, in a two-dimensional image detecting apparatus manufactured by the manufacturing method of the present invention, sealing is carried out so that the sealing member is secured to the substrate and the counter substrate. This makes it possible to ensure a predetermined distance between the substrate and the counter substrate and prevent deformation of the mold structure.

Thus, according to the present invention, the mold structure makes it possible (a) to protect the conversion layer and the upper electrode from moisture (water), dust, and the like, (b) to prevent electrical discharge caused by a high voltage applied to the upper electrode, and (c) to provide a two-dimensional image detecting apparatus which can be applied to mammography.

Note that the substrate and the counter substrate are cut in the non-detection area of the substrate in the cutting step. The present invention is not limited to this, but a cutting position (hereinafter referred to as cutting line) may be provided so as to cut the substrate, the counter substrate, and the spacer material, as discussed later, provided that the cutting line is in the non-detection area of the substrate.

Further, in the method for manufacturing a two-dimensional image detecting apparatus of the present invention, it is preferable that in the cutting step, the spacer material is cut so that the respective cut surfaces of the substrate and the counter substrate and a cut surface of the spacer material are flush with each other.

With the above arrangement, the spacer material is disposed between the counter substrate and the active matrix substrate even after having been cut in the cutting step. As a result, the outer edge of the two-dimensional image detecting apparatus and the image detection area come close to each other, and the spacer material and a sealing member, which is disposed in the following sealing step, ensures a distance between the counter substrate and the substrate. This makes it possible to provide a two-dimensional image detecting apparatus without deformation of a mold structure, after the two-dimensional image detecting apparatus is cut in the cutting step.

As in the above arrangement, in a case where a portion of the spacer material is separated in such a manner that the rest of the spacer material remains on the side of the image detection area of the substrate after the spacer material is cut, the substrate and the spacer can be practically separated in the separation step. That is, there can be a case where the counter substrate is in contact with only a portion of a surface (contact surface) of the spacer where the spacer is in contact with the counter substrate. In such a case, the substrate and the spacer are practically separated in the separation step.

Still further, in the method for manufacturing a two-dimensional image detecting apparatus of the present invention, it is preferable that in the cutting step, the mold structure is cut so that the respective cut surfaces of the substrate and the counter substrate and a cut surface of the mold structure are flush with each other.

With the above arrangement, the conversion layer remains fully covered by the mold structure even after having been cut in the cutting step.

With this arrangement, a two-dimensional image detecting apparatus manufactured by the manufacturing method of the present invention can make the outer edge of the two-dimensional image detecting apparatus and the image detection area close to each other and can be applied to mammography. Additionally, even after the two-dimensional image detecting apparatus is cut, the conversion layer is not bare from a cut surface of the two-dimensional image detecting apparatus, and the conversion layer is therefore prevented from being contaminated by air and water. As such, it is possible to further enhance reliability of the two-dimensional image detecting apparatus.

Further, in the method for manufacturing a two-dimensional image detecting apparatus of the present invention, it is preferable that in the cutting step, (i) the mold structure and (ii) a portion of the conversion layer with which the image detection area is not covered are cut so that the respective cut surfaces of the substrate and the counter substrate, a cut surface of the mold structure, and a cut surface of the conversion layer are flush with each other.

With this arrangement, a two-dimensional image detecting apparatus manufactured by the manufacturing method of the present invention can make the outer edge of the two-dimensional image detecting apparatus and the image detection area very close to each other in part.

That is, since the cut surface of the conversion layer is included in the cut surfaces, the cut surfaces formed in the cutting step are very close to the image detection area.

With the above arrangement, a two-dimensional image detecting apparatus manufactured by the manufacturing method of the present invention can be applied to mammography. Even in detecting an image of a subject which cannot be separated from a base plane, it is possible to excellently detect an image of the subject near the base plane.

Further, as discussed above, according to the manufacturing method of the present invention, these cut surfaces are sealed with the sealing member in the sealing step. For example, due to a difference in coefficient of expansion between the conversion layer, which is made of semiconductor, and the substrate, the conversion layer is likely to be peeled off at its cut surface. However, it is possible to prevent the conversion layer from being peeled off at its cut surface because the cut surface of the conversion layer and the cut surface of the substrate are strongly secured (sealed) with the sealing member.

Still further, in the method for manufacturing a two-dimensional image detecting apparatus of the present invention, it is preferable that a mounting step of mounting circuit components is further included, and the substrate is cut at its one end in the cutting step, and the circuit components to be mounted in the mounting step are mounted in the non-detection area on two ends of the substrate which are adjacent to the one end, so that the circuit components are located away from the one end.

With the above arrangement, circuit components including gate driver LSI (large-scale integrated) circuits and signal reading amplifier LSI circuits are mounted without any problem even if a width of an area where all of the LSIs are arranged at ends adjacent to a cut end exceeds a width of the image detection area. Further, it is possible to prevent overlap between leads 30 of a signal line and the cutting line.

In the method for manufacturing a two-dimensional image detecting apparatus of the present invention, it is preferable that the spacer material is identical in vulnerability with the substrate and the counter substrate.

With the above arrangement, the way the substrate, the counter substrate, and the spacer material are cut in the cutting step become identical. This makes it possible to finely finish the cut surfaces even when these members are cut at once.

Note that "identical vulnerability" means both completely identical vulnerability and substantially identical vulnerability. Especially, in a case materials have completely identical vulnerability, they are identical with each other.

In the method for manufacturing a two-dimensional image detecting apparatus of the present invention, it is preferable that the mold structure is made of a material having insulation properties.

With this arrangement, it is possible to fill the gap between the conversion layer and the counter substrate with the substance providing electrical isolation. This avoids the occurrence of electrical discharge into the components around the conversion layer even when a high voltage is applied to the conversion layer for the use of the two-dimensional image detecting apparatus. Thus, it is possible not only to prevent contamination of the substrate and the conversion layer, but also to prevent performance degradation of the conversion layer due to the electrical discharge. This makes it possible to provide a two-dimensional image detecting apparatus of higher reliability.

As discussed above, a two-dimensional image detecting apparatus manufacture by the manufacturing method of the present invention is an apparatus operating in the "direct conversion scheme" and therefore used for applications that require high resolution. Further, the two-dimensional image detecting apparatus, which includes the mold structure, can protect the conversion layer and the upper electrode from moisture (water), dust, and the like, and can prevent the occurrence of electrical discharge caused by a high voltage applied to the upper electrode. Still further, while having the mold structure, the two-dimensional image detecting apparatus has a part where the outer edge of the two-dimensional image detecting apparatus and the image detection area are close to each other. As such, when the two-dimensional image detecting apparatus is applied to mammography, it is possible to excellently detect images.

Additional objects, features, and strengths of the present invention will be made clear by the description below. Further, the advantages of the present invention will be evident from the following explanation in reference to the drawings.

BRIEF DESCRIPTION OF DRAWINGS

FIG. 1 is a cross-sectional view illustrating the structure of a radiation detecting apparatus as a two-dimensional detecting device according to First Embodiment of the present invention.

BEST MODE FOR CARRYING OUT THE INVENTION

First Embodiment

Figure 2:
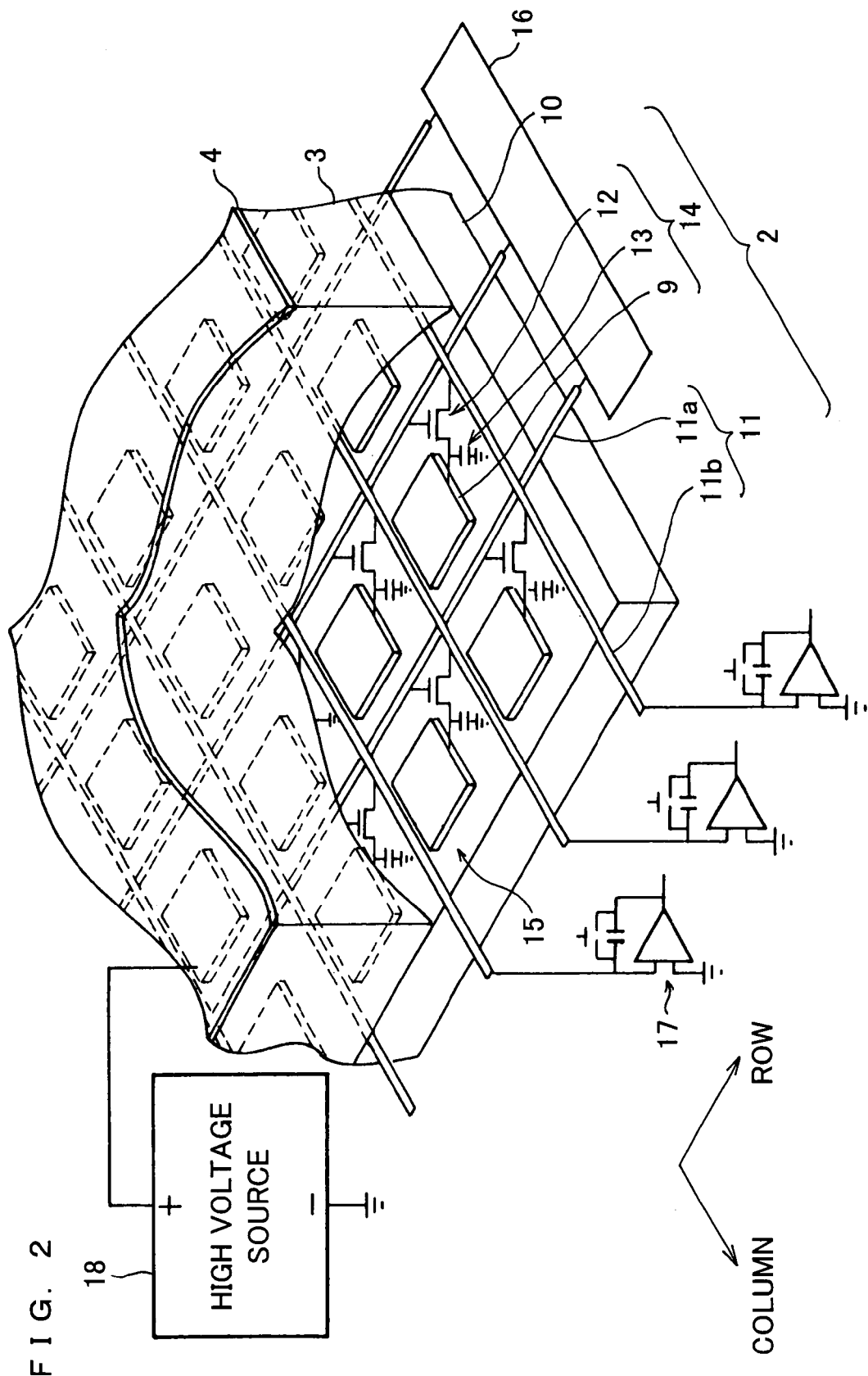
FIG. 2 is a perspective view illustrating a basic structure of a radiation detecting apparatus formed in a manufacture process according to First Embodiment of the present invention.

The following description will discuss one embodiment of the present invention with reference to FIGS. 1 through 7.

Note that the following description includes a variety of technically preferable limitations to carry out the present invention. However, the scope of the present invention is not limited to the description of the embodiments below and the drawings. In the present embodiment, a flat-panel radiation detecting apparatus will be described as a two-dimensional image detecting apparatus according to the present invention.

FIG. 1 is a cross-sectional view illustrating the structure of a radiation detecting apparatus 1 according to one embodiment of the present invention. For example, the radiation detecting apparatus 1 illustrated in FIG. 1 is adopted as one of apparatuses for medical diagnosis, and is used as means for irradiating a subject including a human and an animal with X rays to take their X-ray images. For the reason, the radiation detecting apparatus 1 of the present embodiment includes an active matrix substrate (substrate) 2, a conversion layer 3, and an upper electrode 4. The radiation detecting apparatus 1 further includes a spacer material 5, a counter substrate 6, and a sealing plate (sealing member) 7. A mold resin layer (mold structure) 8 is formed in a gap between the conversion layer 3, the spacer material 5, the counter substrate 6, and the sealing plate 7.

The active matrix substrate 2 is substantially rectangular (quadrangular). On a surface of the active matrix substrate 2, a plurality of pixel electrodes are arranged in an XY matrix. This active matrix substrate 2 can be identical in basic structure with an active matrix substrate which is formed in the production process of a liquid crystal display device. The structure of the active matrix substrate 2 will be described with reference to FIG. 2.

As illustrated in FIG. 2, the active matrix substrate 2 includes a glass substrate 10, electrode wires (gate electrode lines 11a and data electrode lines 11b) 11 formed on the glass substrate 10, thin-film transistors (hereinafter referred to as TFTs) (active elements) 12 as switching elements, electric charge storage capacitances 13, pixel electrodes 9, and other members.

Pixels 14 are each constituted by the TFT 12, the electric charge storage capacitance 13, the pixel electrode 9, and other members. The pixels 14 are arranged in a XY matrix (arranged in rows and columns). The TFT 12 has a gate electrode 12a and a data electrode 12b, which are connected to the gate electrode line 11a and the data electrode line 11b, respectively. The pixels 14, when arranged to form a XY matrix or other regulated patterns, will be collectively referred to as a TFT array (active element array) 15. The area in which the TFT array 15 is formed will be referred to as a pixel detection area.

The gate electrode line 11a extends along the rows of the active matrix substrate 2, being connected at its end to a driver LSI circuit (circuit component) 16, whilst the data electrode line 11b extends along the columns of the active matrix substrate 2, being connected at its end to an amplifier LSI circuit (circuit component) 17 (The driver LSI circuit 16 and the amplifier LSI circuit 17 are collectively referred to as LSI, except when need to be considered in isolation from each other).

As illustrated in FIG. 2, the upper electrode 4 is connected to a high voltage source 18 so as to apply voltage to Cs electrodes 19 detailed later.

Figure 3:
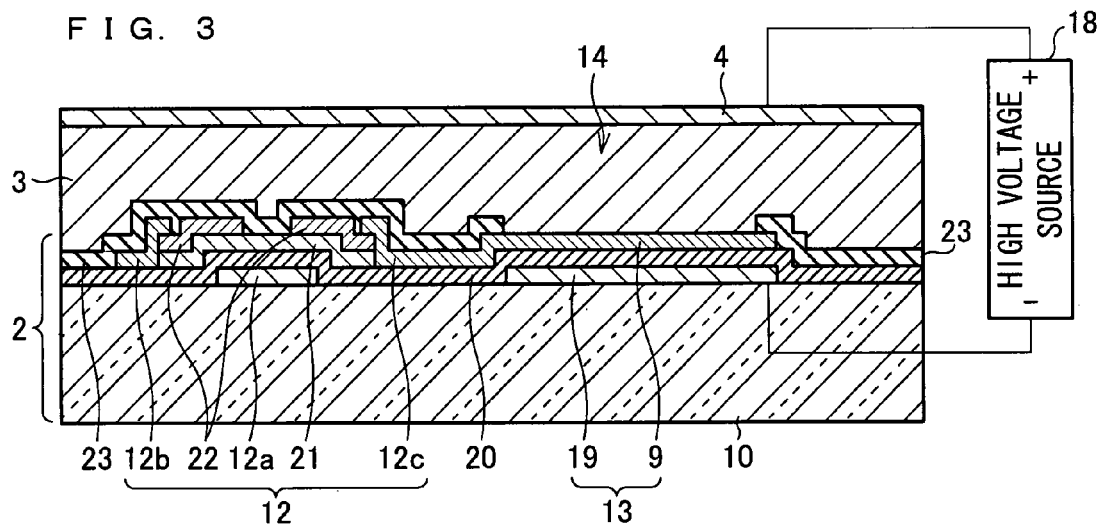
FIG. 3 is a cross-sectional view of one pixel in the radiation detecting apparatus in FIG. 2.

Next, referring to FIG. 3, the structure of one pixel 14 will be described in detail. FIG. 3 is a cross-sectional view illustrating one pixel 14 in the radiation detecting apparatus 1. The drain electrode 12c of the TFT 12 is extended to form the pixel electrode 9. The pixel electrode 9 is adapted so as to switch to the data electrode 12b of the TFT 12 upon the application of a signal to the gate electrode 12a of the TFT 12 through the gate electrode line 11a (FIG. 2), that is, to switch electrical connection between the data electrode line 11b (see FIG. 2) and the pixel electrode 9 (see FIG. 2).

Combined with the Cs electrode 19 across a gate insulation film 20, the pixel electrode 9 forms an electric charge storage capacitance 13. The electric charge storage capacitance 13 stores electric charges from the conversion layer 3 as image information, when the high voltage source 18 applies voltage across the Cs electrode 19 and the upper electrode 4.

The TFT 12 has a structure made up of sequentially deposited thin films, including the gate electrode 12a, the gate insulation film 20, and an amorphous silicon layer 21. The TFT 12 further includes the data electrode 12b and the drain electrode 12c deposited on individual contact layers 22 over the common amorphous silicon layer 21.

An insulation protection film 23 is then formed to cover other parts than those on the pixel electrode 9 of the pixel 14 and provide protection to the TFT 12 and other members.

On the active matrix substrate 2 having the above-mentioned structure, the conversion layer 3 is formed so as to cover the pixel detection area. On the conversion layer 3, the upper electrode 4 is formed.

The conversion layer 3 is of substantially rectangular shape and has an area smaller than that of the active matrix substrate 2. The conversion layer 3 is formed on the image detection area of the active matrix substrate 2, i.e. on the area where the pixel electrodes are arranged. The conversion layer 3 is a semiconductor material having properties of generating electric charges when absorbing irradiation. Examples of the semiconductor material include amorphous selenium (a-Se), amorphous silicon (a-Si), cadmium tellurium (CdTe), cadmium zinc tellurium, lead iodide ($PbI_2$), and mercury iodide ($HgI_2$). Especially, amorphous selenium is able to be deposited on the active matrix substrate 2 having a large area at a low temperature because of its low dark current. To use amorphous selenium as a conversion layer, it is preferable that the conversion layer has a thickness ranging from 0.2 mm to 1.5 mm in consideration of its X-ray absorption efficiency. For mammography purposes, a thickness of the conversion layer is set in the range from 0.2 mm to 0.5 mm.

The upper electrode 4 is formed on a substantially entire surface of the conversion layer 3. The upper electrode 4 can be a thin film made of metal (e.g. gold (Au)). It is preferable that a thickness of the upper electrode 4 is not more than 1 μm.

As illustrated in FIG. 1, the radiation detecting apparatus 1 includes the spacer material 5 around the conversion layer 3. The spacer material 5 is formed on an area where an image of a subject is not detected (non-detection area), which area is provided in the outer region of the surface of the active matrix substrate 2, so as to surround the conversion layer 3.

Further, the radiation detecting apparatus 1 includes the mold resin layer 8 formed so as to cover the entire upper surface of the conversion layer 3, on which surface the upper electrode 4 is formed. On the upper electrode 4 is provided the counter substrate 6, which is supported by the spacer material 5. That is, the mold resin layer 8 is formed by sealing a mold resin into a gap between the conversion layer 3, on which surface the upper electrode 4 is formed, the counter substrate 6, and the spacer material 5 in the manufacturing steps described later.

A material for the mold resin layer 8 is preferably a hardened resin which is in a liquid state before it is filled into a gap between (i) the active matrix substrate 2, on which surface the conversion layer 3 is formed, and (ii) the counter substrate 6, and hardens after the hardened resin is filled into the gap therebetween, so that the gap therebetween is filled with the mold resin layer 8 without cracks. Examples of the hardened resin include acrylic hardened resin and epoxy hardened resin. In terms of radiation tolerance, the hardened resin is preferably epoxy resin. However, the present invention is not limited to this. Specifically, the mold resin is preferably a substance made of a material providing electrical isolation.

When the mold resin layer 8 is realized by a substance made of a material providing electrical isolation, it is possible to fill the gap between the conversion layer 3 and the counter substrate 6 with the substance providing electrical isolation. This avoids the occurrence of electrical discharge into the components around the conversion layer 3 even when a high voltage is applied to the conversion layer 3 for the use of the radiation detecting apparatus 1. Thus, it is possible not only to prevent contamination of the active matrix substrate 2 and the conversion layer 3, but also to prevent performance degradation of the conversion layer 3 due to the electrical discharge. This makes it possible to provide a radiation detecting apparatus 1 of higher reliability.

A thickness of the mold resin layer 8 is preferably set to be in a range from 0.1 mm to 3 mm. The above-mentioned radiation detecting apparatus 1 can be closely analogous to a laminated structure with the active matrix substrate 2, the conversion layer 3, the mold resin layer (mold structure) 8, and the counter substrate 6, which are essential components. In this arrangement, warpage can occur in a radiation detecting apparatus, according to differences between the components in a thermal coefficient of expansion and a coefficient of elasticity. However, it is possible to minimize the occurrence of the warpage by appropriately setting a thickness of the mold resin layer in a range from 0.1 mm to 3 mm.

The counter substrate 6 is provided so as to protect the active matrix substrate 2, on which the conversion layer 3 and the upper electrode 4 are formed in sequence. The counter substrate 6 can be a glass substrate, for example.

The sealing plate 7 is provided to cut surfaces formed in a cutting step, as will be described later, and bonded to cut surfaces of at least the active matrix substrate 2 and the counter substrate 6. This allows the radiation detecting apparatus 1 to have a predetermined distance between the active matrix substrate 2 and the counter substrate 6. Besides, it is possible to avoid deformation of the mold structure 8, caused by change of a distance between the active matrix substrate 2 and the counter substrate 6.

The sealing plate 7 may be a glass plate having a thickness ranging from 0.05 mm to 1.1 mm. Apart from the glass plate, a plate member made of a material such as ceramic and resin can be used for the sealing plate 7.

The above description discussed the radiation detecting apparatus 1 only in terms of its basic structure, but the radiation detecting apparatus 1 may include other components in practice. For example, an electric charge prevention layer or a dielectric layer (not shown) may be provided between the electrodes and the conversion layer 3 to prevent current from leaking through the pixel electrodes 9 and the upper electrode 4.

Now, the radiation detecting apparatus 1 will be discussed in terms of its operation principles in reference to FIGS. 2 and 3.

As X-rays enter the conversion layer 3, electric charges (electrons-holes) develop in the conversion layer 3. The conversion layer 3 here functions to convert the form of information from electromagnetic wave to electric charges. The developing electrons and holes move toward the anode (toward the upper electrode 4 in FIGS. 2 and 3) and the cathodes (toward the Cs electrodes 19 in FIGS. 2 and 3) respectively due to the voltage applied by the high voltage source 18 across the upper electrode 4 and the Cs electrodes 19, thereby accumulating electric charges in the electric charge storage capacitances 13.

The electric charges thus accumulated in the electric charge storage capacitance 13 are sent to the amplifier LSI circuit 17 through the data electrode line 11b by changing the TFT 12 into an on-state by means of an input signal from the driver LSI circuit 16 via the gate electrode lines 11a. Since the electrode wires 11 (the gate electrode lines 11a and the data electrode lines 11b), the TFTs 12, and the electric charge storage capacitances 13 are arranged in an XY matrix as explained earlier, information on a two-dimensional image is obtainable by sending an input signal sequentially to the gate electrode lines 11a.

The overall arrangement of the radiation detecting apparatus 1 having a basic structure as discussed above will be described in reference to FIG. 4, which is a plan view illustrating the overall structure of the radiation detecting apparatus 1 fabricated by the manufacturing steps of the present embodiment. As illustrated in FIG. 1, the radiation detecting apparatus 1 of the present embodiment has the sealing plate 7 (not shown) disposed on at least one end (cut end) of the active matrix substrate 2, which is of substantially rectangular shape, and an outer edge of the active matrix substrate 2 is close to the image detection area. In a radiation detecting apparatus 1 illustrated in FIG. 4, at one end of the active matrix substrate 2, there exists an area where no LSIs are arranged (That is, the area is referred to as cut end).

Thus, in the radiation detecting apparatus 1 of the present embodiment, no LSIs are arranged at the cut end of the active matrix substrate 2. An outer edge of the radiation detecting apparatus 1 is close to an effective area of the active matrix substrate 2. Because of this, the radiation detecting apparatus 1 of the present embodiment can be applied to mammography.

Figure 4:
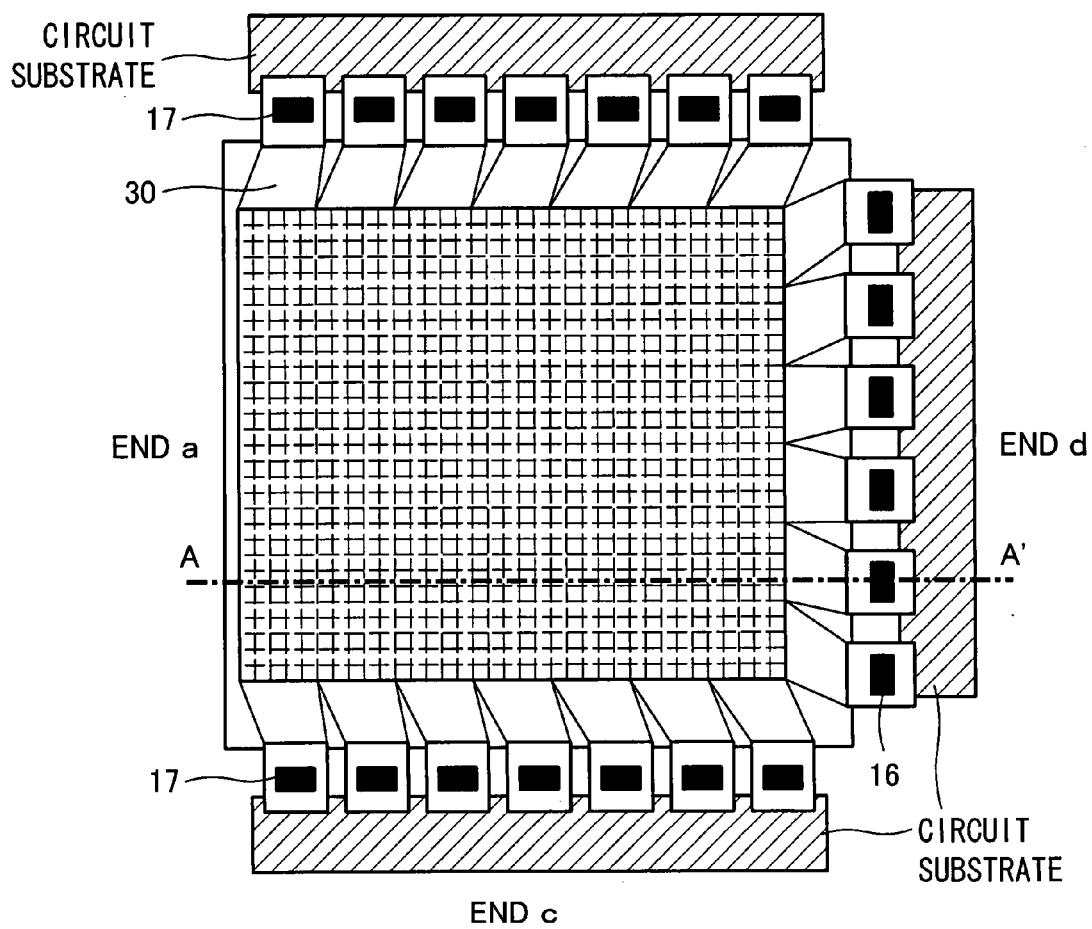
FIG. 4 is a plan view illustrating the structure of the radiation detecting apparatus in FIG. 1.
Figure 5:
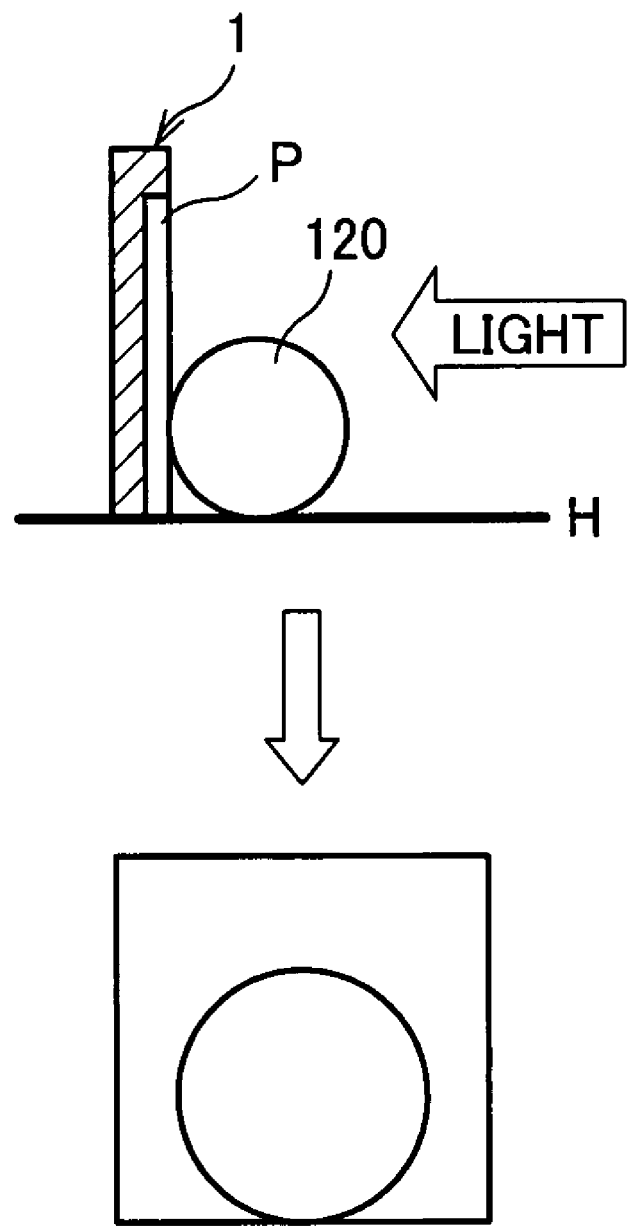
FIG. 5 is a cross-sectional view schematically illustrating a subject and the radiation detecting apparatus according to First Embodiment of the present invention, when applied to mammography, accompanied with their photographed image obtained by photographing in mammography.
Figure 15:
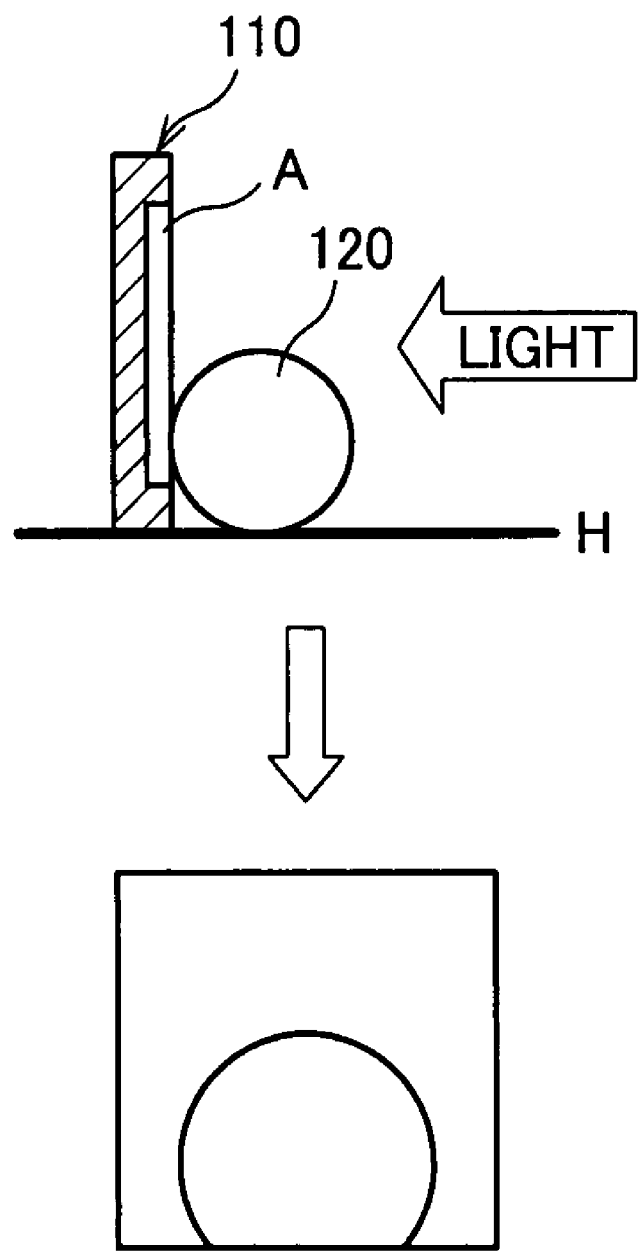
FIG. 15 is a cross-sectional view schematically illustrating a subject and the flat-panel radiation detecting apparatus which operates in the "direct conversion scheme" in the conventional art, illustrated in FIG. 13, when applied to mammography, accompanied with their photographed image obtained by photographing in mammography.

In mammography (X-ray photography only for breasts), a subject (i.e. breast) must be brought intimate contact with a photographing side of a photographing apparatus to take an image of the subject. The mammography is described with reference to FIGS. 15 and 5. FIG. 15 is a cross-sectional view schematically illustrating a relation between a general photographing apparatus in the conventional art and a subject 120. FIG. 5 is a cross-sectional view schematically illustrating a relation between the radiation detecting apparatus 1 of the present embodiment and the subject 120. Examples of the subject H include a part that lies off a base plane H and an object that cannot be physically separated from the base plane H. Illustrations in FIGS. 15 and 5 assume that the subject 120 is a round object that cannot be physically separated from the base plane H. Note that the base plane H is inviolable so that it is impossible for a two-dimensional image detector and the radiation detecting apparatus 1 to enter the base plane H. As illustrated in FIG. 15, an X-ray image of the whole of the subject 120 cannot be obtained in the conventional two-dimensional image detector because part of the subject lies off the image detection area. On the contrary, in a case of using the radiation detecting apparatus 1 illustrated in FIG. 5, one end (end a in FIG. 4) of the active matrix substrate 2 is close to the outer edge of the radiation detecting apparatus 1, as described previously. That is, at this end, the outer edge of the radiation detecting apparatus 1 is close to an image detection area P. As such, it is possible to obtain an X-ray image of the whole of the subject 120 as illustrated in FIG. 5.

Figure 13:
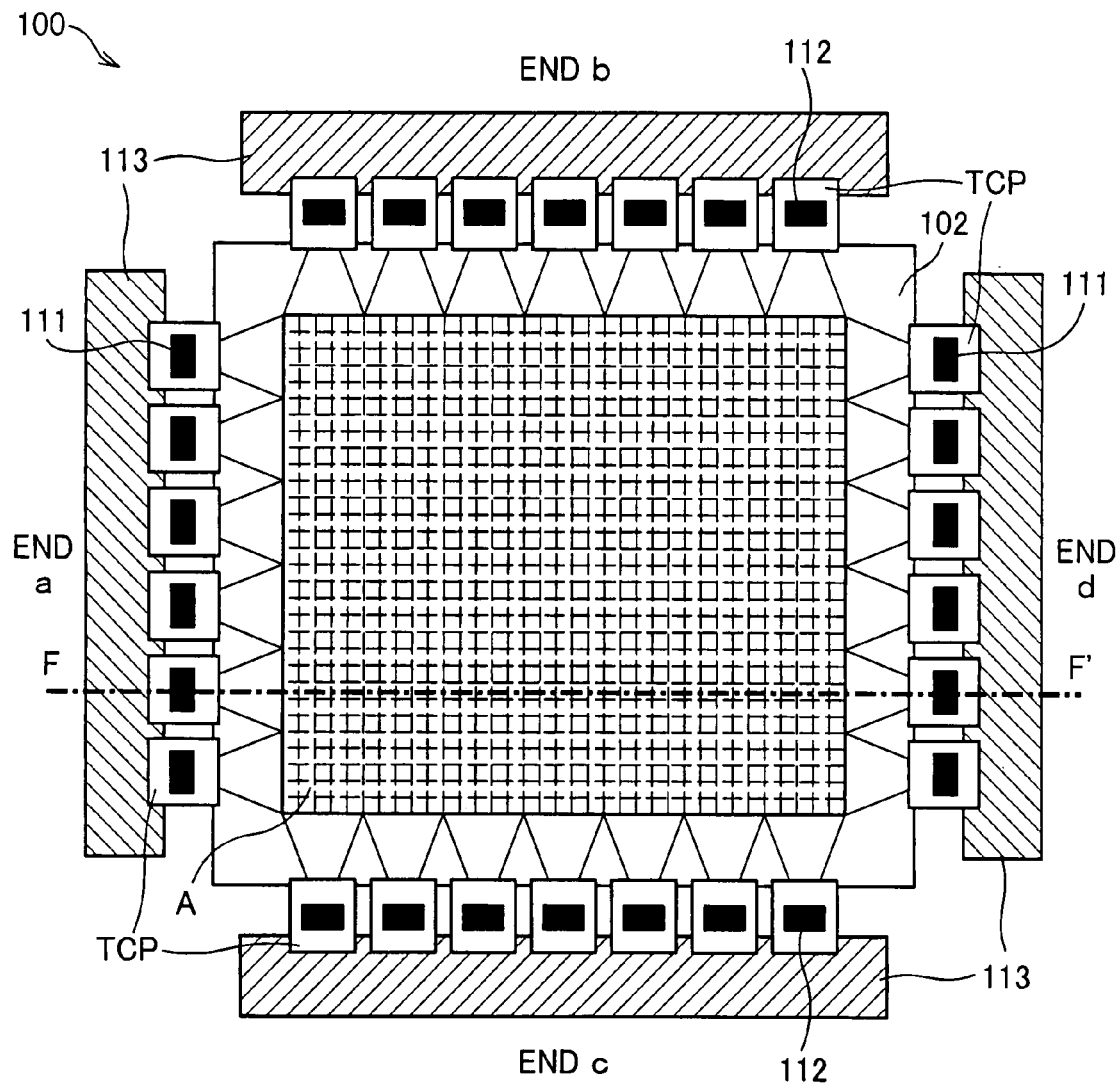
FIG. 13 is a plan view illustrating the structure of a flat-panel radiation detecting apparatus which operates in the "direct conversion scheme" in the conventional art.
Figure 14:
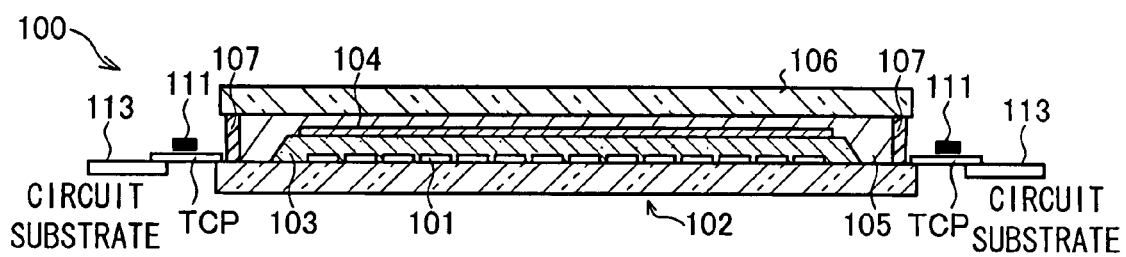
FIG. 14 is a cross-sectional view illustrating the flat-panel radiation detecting apparatus which operates in the "direct conversion scheme" in the conventional art, taken from a F-F' line of FIG. 13.

Incidentally, a radiation detecting apparatus for mammography is demanded to provide a high resolution, and the active matrix substrate is demanded to have a pixel pitch of not more than 100 μm, preferably not more than 50 μm. Accordingly, it is necessary to arrange many LSIs at an end where the LSIs (or TCPs including LSIs formed thereon) are to be mounted (hereinafter referred to as a mounting end). As a result of this, there can be a case where a width of an area where all of the LSIs are arranged at one mounting end exceeds a width of the effective area of the photographing side. The active matrix substrate in the conventional art having a wiring layout as illustrated in FIG. 13 has the following problem: That is, if an end a in FIG. 13 is located very close to the effective area of the photographing side, a space where LSIs are to be mounted becomes narrow at the end a, which is adjacent to the ends b and c. Because of this, the LSI-arranged area cannot be ensured. In order to solve this problem, the present embodiment has a layout such that the LSI-arranged areas at ends b and c (adjacent ends) are disposed so as to be displaced toward an end d, as illustrated in FIG. 4. In other words, LSIs to be mounted on the ends b and c are arranged so as to be away from the end a. With this arrangement, LSIs are mounted without any problem even if a width of an area where all of the LSIs are arranged on one mounting end exceeds a width of the effective area of the photographing side. In forming the end a (cut end described later) by cutting as described later, the problem occurs if there are leads 30 of a signal line along a cutting line. On the contrary, the layout such that the LSI-arranged areas are disposed so as to be displaced toward the side d, makes it possible to prevent overlap between the leads 30 of the signal line and the cutting line.

In an area where LSIs are arranged around the active matrix substrate 2 (non-detection area), the driver LSI circuits 16 and the amplifier LSI circuits 17 are connected to the data electrode lines 11b and the gate electrode lines 11a by TAB (Tape Automated Bonding) or COG (Chip on Glass) techniques, for example. FIG. 4 illustrates a connection by the TAB technique. In FIG. 4, the driver LSI circuits 16 and the amplifier LSI circuits 17 are not fully shown; less than those actually mounted are shown for illustrative purposes only.

Now, the radiation detecting apparatus 1 of the present embodiment will be discussed in terms of its manufacturing method in reference to FIGS. 6 and 7.

Figure 6:
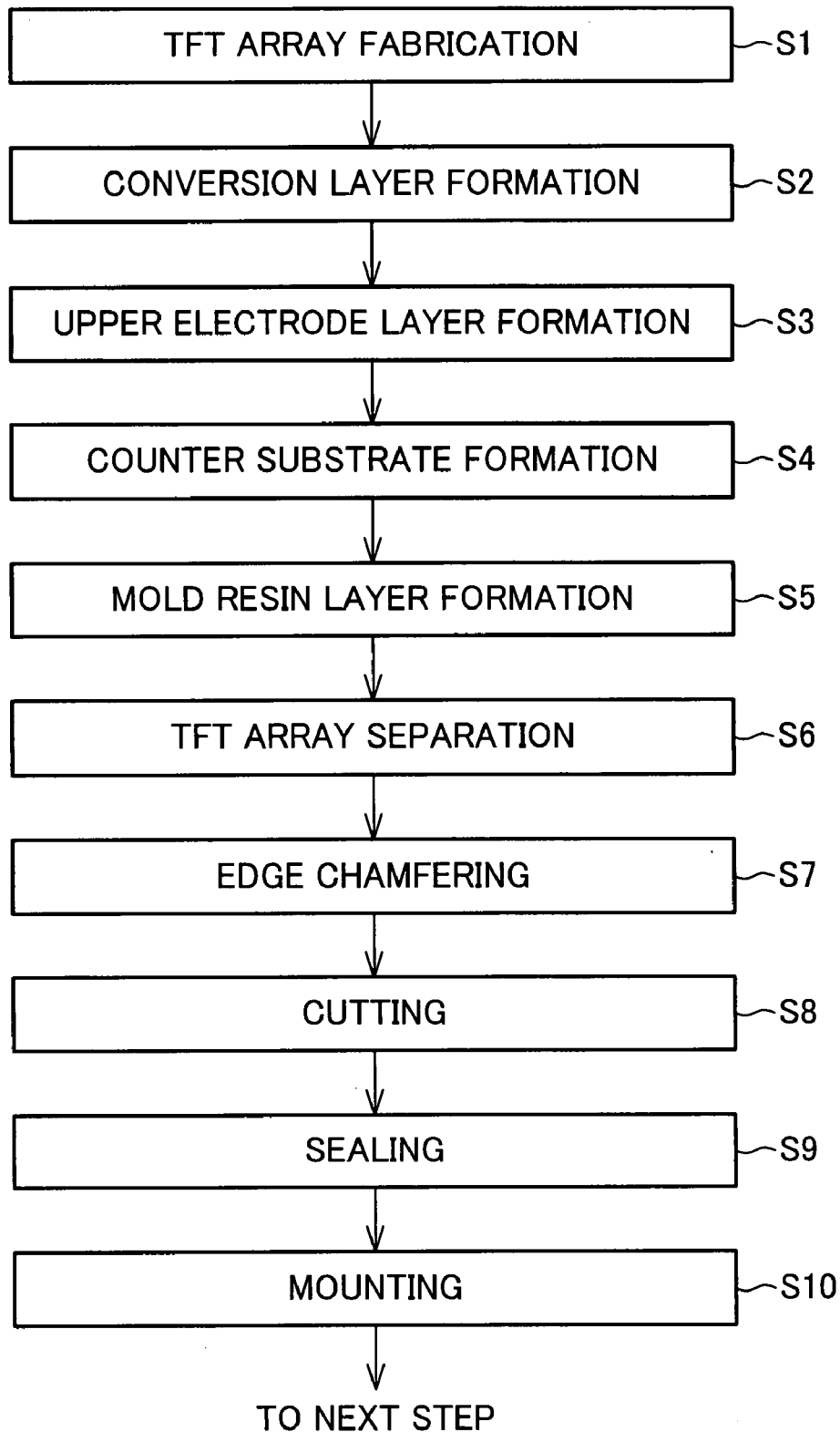
FIG. 6 is a flow chart illustrating manufacturing steps in sequence for a radiation detecting apparatus according to First Embodiment of the present invention.

FIG. 6 is a flow chart illustrating manufacturing steps for the radiation detecting apparatus 1 of the present embodiment. FIG. 7 is cross-sectional views illustrating the radiation detecting apparatus 1 in the manufacturing steps in FIG. 6.

As illustrated in FIG. 6, manufacturing steps for the radiation detecting apparatus 1 of the present embodiment include a TFT array fabrication step (step S1), a conversion layer formation step (Step S2), an upper electrode layer formation step (step S3), a counter substrate formation step (counter substrate disposing step) (step S4), a mold resin layer formation step (mold structure formation step) (step S5), a TFT array separation step (step S6), an edge chamfering step (step S7), a cutting step (step S8), a sealing step (step S9), and a mounting step (step S10).

Figure 7:
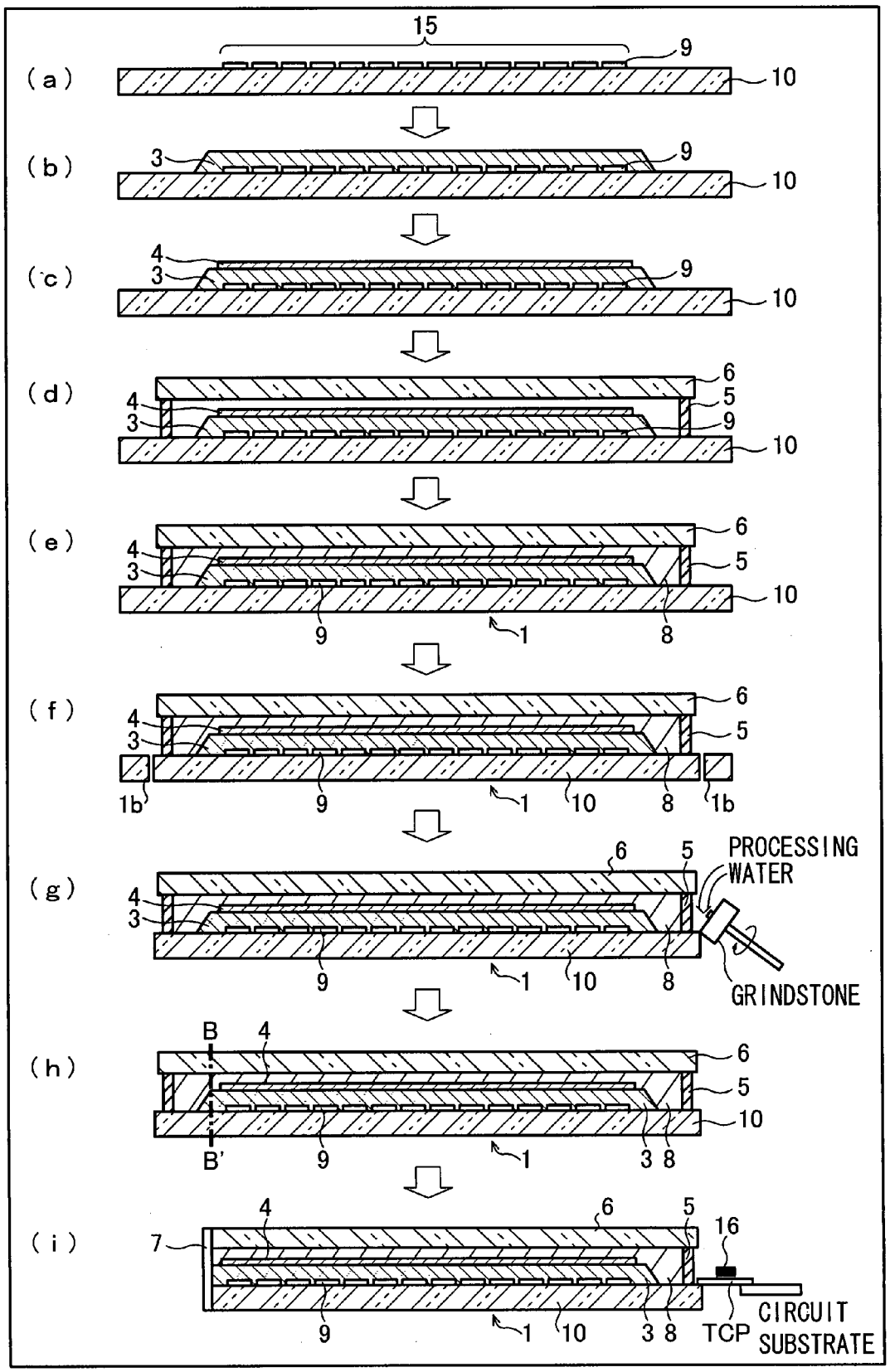
FIG. 7 is cross-sectional views illustrating a radiation detecting apparatus in the manufacturing steps in FIG. 6.

FIG. 7 illustrates cross-sections ((a) through (i)) of the radiation detecting apparatus 1 in the respective steps. The following description will discuss the individual steps in reference to (a) through (i) of FIG. 7.

In the TFT array fabrication step (step S1), a TFT array is fabricated on a glass substrate 10 similarly to manufacturing steps for active matrix liquid crystal display devices. Specifically, on the glass substrate 10 there are provided the electrode wires 11 (gate electrode line 11a data electrode line 11b), TFTs 12 each provided for the pixel 14, the electric charge storage capacitances 13, the pixel electrodes 9, and other members (see FIG. 2). In (a) of FIG. 7, only the glass substrate 10 and the pixel electrodes 9 are shown for simple illustration ((b) through (i) of FIG. 7 are also shown in the same manner).

Here, the glass substrate 10 measures 680 mm×880 mm×0.7 mm. Typically, the measurement of the glass substrate 10 depends on the fabrication device for the TFT array 15 (FIG. 2), exclusively used for substrates of a particular size. An effective area of 200 mm×250 mm is reserved to accommodate each TFT array 15 (FIG. 2), which is decided depending on the image readout area required for the two-dimensional image detector to be manufactured.

The manufacturing method for the TFT array 15 is well known in the art of active matrix liquid crystal display device; specific, detailed description is therefore omitted here.

Next, an a-Se film is formed as a conversion layer 3 in the conversion layer formation step (step S2) ((b) of FIG. 7). Here, since the conversion layer 3 is formed immediately after the formation of the TFT array 15 on the glass substrate 10, there is little likelihood for the surface of the TFT array 32 serving as a bed on which the conversion layer 3 is formed to be contaminated. Therefore, the TFT array 15 is not contaminated, and the conversion layer 3 manufactured has a satisfactory level of quality, enabling the TFT array 15 and the conversion layer 3 fabricated to show very stable performance.

Then, in the upper electrode layer formation step (step S3), an upper electrode 4 is formed on the conversion layer 3 ((c) of FIG. 7).

Subsequently, in the counter substrate formation step (step S4), a counter substrate 6 is provided ((d) of FIG. 7). The counter substrate 6, which is provided in the following manner, not only protects the conversion layer 3 and the upper electrode 4 but also is used in forming a mold resin layer 8, as described previously.

First, a spacer material 5 is formed surrounding the conversion layer 3 along the circumference (non-detection area) of an area where the conversion layer 3 is formed on the glass substrate 10. A counter substrate 6, cleaned beforehand, is then provided opposite to the glass substrate 10, sandwiching the spacer material 5 so as to cover the conversion layer 3 and the upper electrode 4. Here, 0.7 mm-thick glass plate is used. As a material for the spacer material 5 is suitable a material which ensures spacing between the glass substrate 10 and the counter substrate 6. Such a spacer material 5 can be made of ceramic, glass, resin which provides an excellent performance of insulation, or the like. For example, the spacer material 5 can be made of fluorocarbon resin such as Teflon (registered trademark), epoxy resin, silicon resin, ABS resin, glass plate, or ceramic material. These spacer materials 5 are secured to the glass substrate 10 and the counter substrate 6 by bonding with an adhesive (not shown). Further, an adhesive resin into which a solid spacer in the form of beads, rod, or the like is mixed can be used as the spacer material 5.

If the counter substrate 6 and the glass substrate 10 are made of the same material as described above and thus share an equal coefficient of thermal expansion, even when they are secured, the substrate does not warp due to difference in thermal expansion. The counter substrate 6 may be replaced by a sheet of PET (polyethylene terephthalate) or another similar resin.

Here, the gaps between the spacer material 5 and the glass substrate 10 (active matrix substrate 2), between the spacer material 5 and the counter substrate 6 are hermetically sealed (so as to have a hermeticity). This (a) prevents leakage of a mold resin, which is filled in the gaps between the spacer material 5, the active matrix substrate 2, and the counter substrate 6 in the later-described mold resin layer formation step (step S5), (b) prevents processing water and glass particles used or produced in the TFT array separation step (step S6) from entering the gaps between the counter substrate 6, the spacer material 5, and the glass substrate 10. Thus, it is possible to protect the conversion layer 3 and the upper electrode 4 from contaminants.

In the mold resin layer formation step (step S5), a mold resin is filled into the gaps between the spacer material 5, the active matrix substrate 2, and the counter substrate 6 ((e) of FIG. 7). This filling can be performed by means of a through hole (not shown), which is provided in the counter substrate 6. Note that the through hole may be provided in the spacer material 5, instead of the counter substrate 6.

Next, in the TFT array separation step (step S6), the active matrix substrate 2 of a predetermined size is cut from the glass substrate 10 ((f) of FIG. 7). A size of the active matrix substrate 2 needs to be large enough to include (i) an effective area where the TFT array 15 is formed (here, 200 mm×250 mm) and (ii) its surroundings, i.e. an area where drive circuits (amplifier LSI circuits 17 and driver LSI circuits 16 (see FIG. 4)) are mounted. Here, the active matrix substrate 2 measures 240 mm×290 mm.

The glass substrate 10 is cut by a diamond scribe technique. According to a diamond scribe technique, glass or a like material is divided into pieces by applying force to micro cracks, which are formed by drawing scribe lines (mark-off lines) on the surface of the glass or the like material with a diamond blade. The diamond scribe technique has advantages of implementation with an inexpensive device and excellent throughput (performance). On the other hand, the diamond scribe technique has a drawback that broken pieces of glass (cullets) are likely to scatter in drawing scribe lines.

However, in the present embodiment, the spacer material 5 and the counter substrate 6 make it possible to prevent the conversion layer 3, the upper electrode 4, and others from being contaminated and damaged.

Alternatively to the diamond scribe technique, the glass substrate 10 may be cut by dicing with the use of a diamond blade, for example. According to the method, the cutting process is performed while pouring processing water over portions to be cut. The process therefore entails production of contaminants such as processing water, glass particles resulting from abrasion, particles resulting from wearing of the blade. In this method, similarly to the foregoing case, thanks to the spacer material 5 and the counter substrate 6, it is possible to prevent the conversion layer 3, the upper electrode 4, and others from being contaminated and damaged. Further, the glass substrate 10 may be cut by a laser dividing technique.

The edges of the ends of the active matrix substrate 1, along which the active matrix substrate 1 was cut off by the diamond scribe or dicing technique, are fragile and easy to break. Preferably, the edges are subjected to chamfering in the next edge chamfering step as necessary (step S7).

In the edge chamfering step (step S7), the edges are chamfered ((g) of FIG. 7). Typically, in a chamfering process, the chamfered portions (edges) are polished using a grindstone while pouring processing water to those portions. The present embodiment adopts this method. This process also entails production of contaminants such as processing water, glass particles resulting from abrasion, particles resulting from wearing of the blade. In this method also, similarly to the TFT array separation step (step S6), the spacer material 5 and the counter substrate 6 make it possible to prevent the conversion layer 3, the upper electrode 4, and others from being contaminated and damaged.

Next, in the cutting step (step S8), the radiation detecting apparatus 1 is cut in such a manner that respective cut surfaces of at least the active matrix substrate 2 and the counter substrate 6 are flush with each other ((h) of FIG. 7). The following description will discuss the cutting step (step S8).

The radiation detecting apparatus 1 of the present embodiment has the following arrangement. As illustrated in FIG. 4, three ends (ends b, c, d) of the ends of the active matrix substrate 2, which is of substantially rectangular shape, have connections with circuit substrates. On the other hand, no LSIs are mounted on one end (cut end; end a) thereof, and the outer edge of the radiation detecting apparatus 1 is close to the image detection area of the active matrix substrate 2. Therefore, in order to form the cut end (end a), it is necessary to cut the radiation detecting apparatus 1 illustrated in (g) of FIG. 7.

In the radiation detecting apparatus 1 of the present embodiment, the active matrix substrate 2, the counter substrate 6, the mold resin layer 8, and the conversion layer 3 are cut in the cutting step (step S8), so that the respective cut surfaces (cross sections) thereof are flush with each other.

Thus, by adopting the manufacturing method of the present embodiment, it is possible to make the outer edge of the radiation detecting apparatus 1 as close to the pixel detection area where the pixel electrodes 9 are arranged as possible, even when a mold structure is formed. A cutting method in the cutting step (step S8) should be the aforementioned dicing or laser cutting technique.

In the following sealing step (step S9), a cut surface formed in the cutting step (step S8) is sealed with the sealing plate 7. The following description will discuss a position at which the sealing plate 7 is disposed. The sealing plate 7 of the present embodiment is provided so as to cover the entire end faces of not only the active matrix substrate 2 and the counter substrate 6, but also the mold resin layer 8 and the conversion layer 3, of which end faces are flush with each other. This structure has an advantage that a cutting line can be very close to the edge of the effective area of the photographing side. Further, the sealing plate 7 can be secured with an adhesive (not shown) such as an epoxy adhesive.

Thus, by disposing the sealing plate 7, it is possible to prevent the intrusion of moisture and impurity ion from the cut surfaces. This makes it possible to ensure a sufficient reliability of the radiation detecting apparatus 1.

Note that this method reliably prevents the intrusion of moisture and impurity ion from the cut surfaces, as compared with a method in which cut surfaces are just sealed with a molded resin.

Further, due to a difference in coefficient of expansion between the conversion layer 3, which is made of semiconductor (e.g. a-Se), and the active matrix substrate 2, the conversion layer 3 is likely to be peeled off at its cut surface. However, it is possible to prevent the conversion layer 3 from being peeled off at its cut surface because the cut surface of the conversion layer 3 and the cut surface of the active matrix substrate 2 are strongly secured by the sealing plate 7. Especially, in a case where amorphous selenium (s-Se) is used as a material for the conversion layer, the problem that the conversion layer 3 is peeled off often arises. This is because the glass substrate 10, which is a base material for the active matrix substrate 2, and a a-Se film are different in coefficient of expansion by approximately one order of magnitude. However, a thickness of the conversion layer 3 is in a range from 0.2 mm to 1.5 mm, and an area of the cut surface of the conversion layer 3 is therefore relatively large (as compared with a thin semiconductor film). This ensures a sufficient bonding area of the sealing plate 7 which is bonded to the cut surface of the conversion layer 3, thus preventing a film peeling with a sufficient reliability.

Next, in the mounting step (step S10), driver LSI circuits 16 and amplifier LSI circuits 17 are mounted to the periphery (sides b, c, d in FIG. 4) of the active matrix substrate 2 by the aforementioned TAB or COG technique. It should be noted that the mounting is performed with the temperature of the active matrix substrate 2 under control so that the heat generated by the mounting does not increase the temperature so much as to cause the a-Se film, serving as the conversion layer 3, to crystallize. In the present embodiment, TAB technique is used in the mounting step.

Note that a sensor bias lead line (not shown) for connecting the upper electrode 4 and the high voltage source 18 (see FIG. 2) should be connected to the upper electrode 4 in advance at the time when the counter substrate 6 is provided, and then removed through a through-hole (not shown) which is provided on the counter substrate or a through-hole (not shown) which is provided on the sealing material 5.

The radiation detecting apparatus 1 thus fabricated subsequently undergoes assembly steps in which the high voltage source 18 (see FIG. 2) and other components, will be attached to complete the entire manufacture process. Description of those subsequent steps is omitted.

In the above description of the present embodiment, the radiation detecting apparatus 1 for detecting X-ray images for mammography were discussed. However, the present invention is not limited to this: electromagnetic waves in various wavelength ranges including visible, infrared, and ultraviolet light, as well as X-rays, can be detected. To detect electromagnetic waves other than X-rays, the conversion layer 3 should be adjusted so as to properly handle the target electromagnetic waves.

The a-Se film used above as the conversion layer 3 exhibits a satisfactory level of photoconductivity to visible light. To take advantage of this characteristic, studies are under way to develop supersensitive image sensors by means of the avalanche effect under high voltage application. The present invention is also effective if used in the manufacture of the supersensitive image sensors.

Thus, as described previously, a method for manufacturing the radiation detecting apparatus 1 of the present embodiment includes: the steps (steps S1 through S7 in FIG. 6) of forming a radiation detecting apparatus having a mold structure; the cutting step (step S8) (FIG. 6) of cutting the active matrix substrate 2, the counter substrate 6, the conversion layer 3, and the mold resin layer 8 so that the respective cut surfaces of the active matrix substrate 2, the counter substrate 6, the conversion layer 3, and the mold resin layer 8 are flush with each other at least one end (which is a narrow end) of the active matrix substrate 2; and the sealing step (step S9) of sealing the cut surfaces with a sealing member. That is, adopted is the following method: the mold resin layer 8 is formed by filling the mold resin in a state in which the spacer material 5 is disposed so as to surround the conversion layer 3, and thereafter a predetermined area (cut end of the active matrix substrate 2) is cut. However, the present invention is not limited to this. An alternative manufacturing method may be adopted in which predetermined ends of an active matrix substrate and a counter substrate are cut in advance and thereafter a mold structure is formed. However, the foregoing method has the following effects: it is easy to evenly form a mold structure between the counter substrate and the active matrix substrate 2 because the spacer material is disposed before a mold is formed at the predetermined end to be cut off later. Also, a mold resin filling operation becomes easy because the spacer material serves as a wall in filling a mold resin.

Further, in a case where the active matrix substrate 2 includes a resin insulation film (not shown) (e.g. interlayer insulation film for separating a pixel electrode-formed surface and a TFT-formed surface from each other or a planarizing film for planarizing a pixel electrode-formed surface) as components, a preferable layout is such that the resin insulation film does not exist in the vicinity of the cutting line so that the resin insulation film is not bare in the cut surface. In many cases, a typical resin insulation film constituting an active matrix substrate 2 often exhibits hygroscopicity. As such, consideration must be given to environmental conditions in which a resin insulation film is handled. With the above layout in which the resin insulation film is not bare in the cut surface, it is possible to ensure reliability of the active matrix substrate 2 in the cutting step.

Note that the counter substrate 6 can be a ceramic substrate, a resin substrate, or the like, instead of a glass substrate. A ceramic substrate or a resin sheet (plate) may be used in place of the protection glass plate 35a. The use of a solid substrate composed of a ceramic substrate (including glass substrate) is advantageous in that the active matrix substrate 2 is reinforced. Meanwhile, the use of a solid substrate composed of a resin sheet (plate) is advantageous in that the solid substrate becomes easy to fabricate, which facilitates the formation of the through-hole and notch, and also in that the smaller weight of the solid substrate than a ceramic substrate allows a reduction in the weight of a radiation detecting apparatus itself.

The alternative member to the counter substrate 6 is preferably composed of material that does not interfere with X-rays incident to the conversion layer 3. A preferred example of such a ceramic substrate is composed of any one of the ceramic materials consisting of aluminum oxide, aluminum nitride, boron nitride, silicon oxide, silicon nitride, and silicon carbide. The ceramic substrates absorb only limited amounts of X-rays; therefore the use of the ceramic substrates does not cause a significant drop in the sensitivity of the two-dimensional image detector. By contrast, a ceramic substrate containing a relatively large proportion of an element of a large atomic number, such as Ba, Pb, or Sn, absorbs large portions of X-rays and likely to degrades the sensitivity of the radiation detecting apparatus.

If two or more of the foregoing ceramic materials are used in mixture, the coefficient of thermal expansion of the ceramic substrate can be arbitrarily adjusted by changing the ratio of the mixture. Accordingly, a ceramic substrate can be fabricated with a coefficient of thermal expansion substantially equal to that of the active matrix substrate 2. The ceramic substrate does not warp due to a difference in coefficients of thermal expansion even when both the substrates (the counter substrate 6 and the active matrix substrate 2) are disposed sandwiching a spacer material.

A resin sheet (plate) will hardly absorb X-rays and avoid degradation of the sensitivity of the radiation detecting apparatus. Especially, if the sheet (plate) is made of a resin material containing no Si, these advantages are enhanced. Such resin materials containing no Si include acrylic resins, polycarbonate (PC), polyethylene terephthalate (PET), polystyrene, polyimide, polyvinyl chloride resin, nylon, ABS resins, polyethylene, polypropylene.

Second Embodiment

The following description will discuss another embodiment in accordance with the present invention. In the present embodiment, differences from First Embodiment are discussed. For convenience of explanation, members that have the same function as members of First Embodiment are represented by the same reference numerals and description thereof is omitted.

Figure 8:
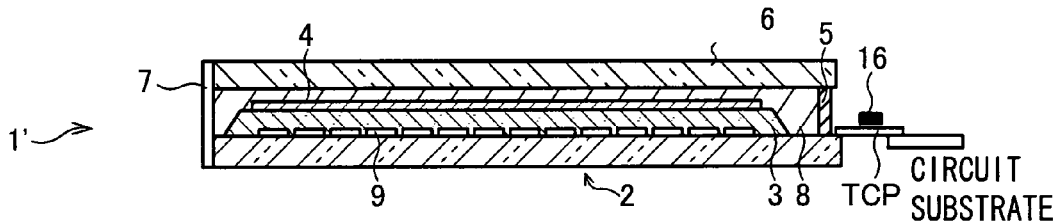
FIG. 8 is a cross-sectional view illustrating the structure of a radiation detecting apparatus according to Second Embodiment of the present invention.
Figure 9:
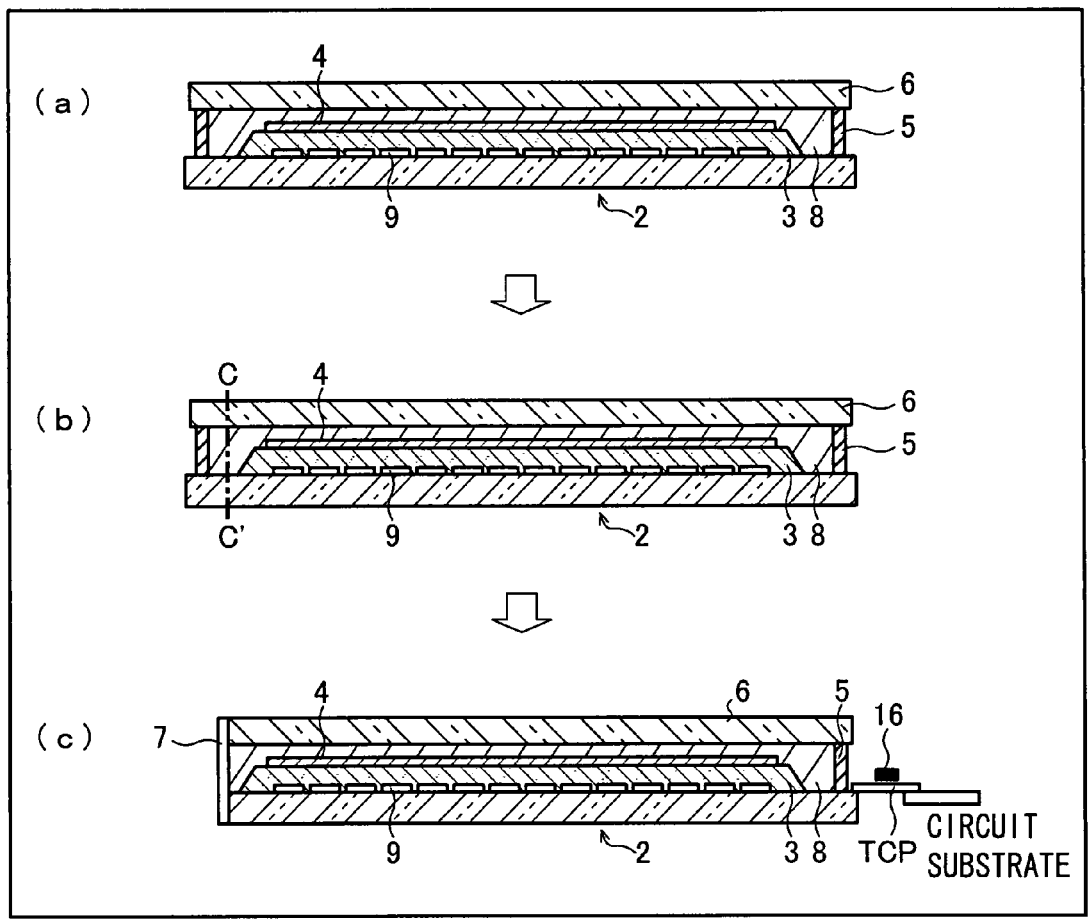
FIG. 9 is cross-sectional views illustrating a radiation detecting apparatus in some steps of manufacturing steps for a radiation detecting apparatus according to Second Embodiment of the present invention.

The following description will discuss another embodiment of the present invention with reference to FIGS. 8 and 9. FIG. 8 is a cross-sectional view illustrating a structure of a radiation detecting apparatus 1' of the present embodiment. FIG. 9 illustrate cross-sectional views ((a) through (c)) of the radiation detecting apparatus 1' in manufacturing steps for a radiation detecting apparatus 1' of the present embodiment.

Steps in a method for manufacturing a radiation detecting apparatus 1' of the present embodiment are not shown since they are the same as steps (FIG. 6) in the method for manufacturing a radiation detecting apparatus 1, which has been described in First Embodiment.

In First Embodiment described above, the radiation detecting apparatus 1, as illustrated in FIG. 1, is arranged so that the sealing plate 7 is bonded to cut surfaces of the active matrix substrate 2, the conversion layer 3, the mold structure layer 8, and the counter substrate 6, all of which are flush with each other. On the contrary, the radiation detecting apparatus 1' of the present embodiment is arranged so that a sealing plate 7 is bonded to cut surfaces of a active matrix substrate 2, a mold structure layer 8, and a counter substrate 6, all of which are flush with each other. In other words, a cutting position in a method for manufacturing the radiation detecting apparatus 1' discussed below is different from that in First Embodiment.

The following description will discuss a method for manufacturing the radiation detecting apparatus 1' of the present embodiment.

As described previously, the radiation detecting apparatus 1' of the present embodiment is manufactured through the steps that are the same as the steps (FIG. 6) in a method for manufacturing the radiation detecting apparatus 1, discussed in First Embodiment. The present embodiment and First Embodiment are different in a cutting position in a cutting step (step S8) illustrated in FIG. 6.

That is, in the radiation detecting apparatus 1' of the present embodiment, a conversion layer 3 is formed so as to cover an image detection area on the active matrix substrate 2 in steps S1 through S3 of FIG. 6, and an upper electrode 4 is formed on the conversion layer 3. Then, in step S4 of FIG. 6, a spacer material and the counter substrate 6 are provided. In step S5 of FIG. 6, a mold resin is filled into a gap between the conversion layer 3, on which surface the upper electrode 4 is formed, the counter substrate 6, and the spacer material 5 to form a mold structure layer. Subsequently, through steps S6 and S7 of FIG. 6, the radiation detecting apparatus 1' as illustrated in (a) of FIG. 9 is formed in which an outer edge portions of the active matrix substrate 2 are all wide ends.

Next, the following description will discuss the cutting step (step S8 of FIG. 6) of the radiation detecting apparatus 1' of the present embodiment with reference to (b) of FIG. 9.

In the cutting step of the present embodiment, the active matrix substrate 2, the mold structure layer 8, and the counter substrate 6 are cut along a cutting line C-C', as illustrated in (b) of FIG. 9, so that their cut surfaces are flush with each other. The cutting step can be carried out by the method described previously.

After the cutting, the cut surfaces are sealed with the sealing plate 7, whereby the radiation detecting apparatus 1' of the present embodiment as illustrated in (c) of FIG. 9 can be manufactured.

Note that as in First Embodiment, the present embodiment has a layout such that the LSI-arranged areas at ends b and c are disposed so as to be displaced toward an end d, as illustrated in FIG. 4. Thus, even if a width of the whole of the LSI-arranged area at one end which is a wide end exceeds the width of an effective area on a photographing side, the LSIs are mounted without a problem. In forming an end a (cut end described later) by a cutting operation as described later, the problem occurs if there are leads 30 of a signal line along the cutting line. On the contrary, the layout such that the LSI-arranged areas are disposed so as to be displaced toward the end d, makes it possible to prevent overlap between the leads 30 of the signal line and the cutting line.

As compared with First Embodiment, the radiation detecting apparatus 1' has a slightly larger spacing between the sealing plate 7 (outer edge of the radiation detecting apparatus 1') and the pixel detection area, but the conversion layer 3 is covered with the mold resin layer 8 during the cutting step. In other words, the conversion layer 3 does not become bare after the cutting step. This prevents the conversion layer 3 from being contaminated by air and moisture in the cutting step, thus further enhancing reliability.

Third Embodiment

The following description will discuss yet another embodiment in accordance with the present invention. In the present embodiment, differences from First Embodiment are discussed. For convenience of explanation, members that have the same function as members of First Embodiment are represented by the same reference numerals and description thereof is omitted.

Figure 10:
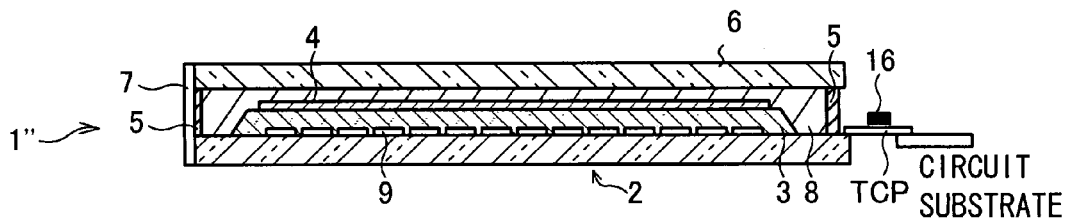
FIG. 10 is cross-sectional views illustrating the structure of a radiation detecting apparatus according to Third Embodiment of the present invention.
Figure 11:
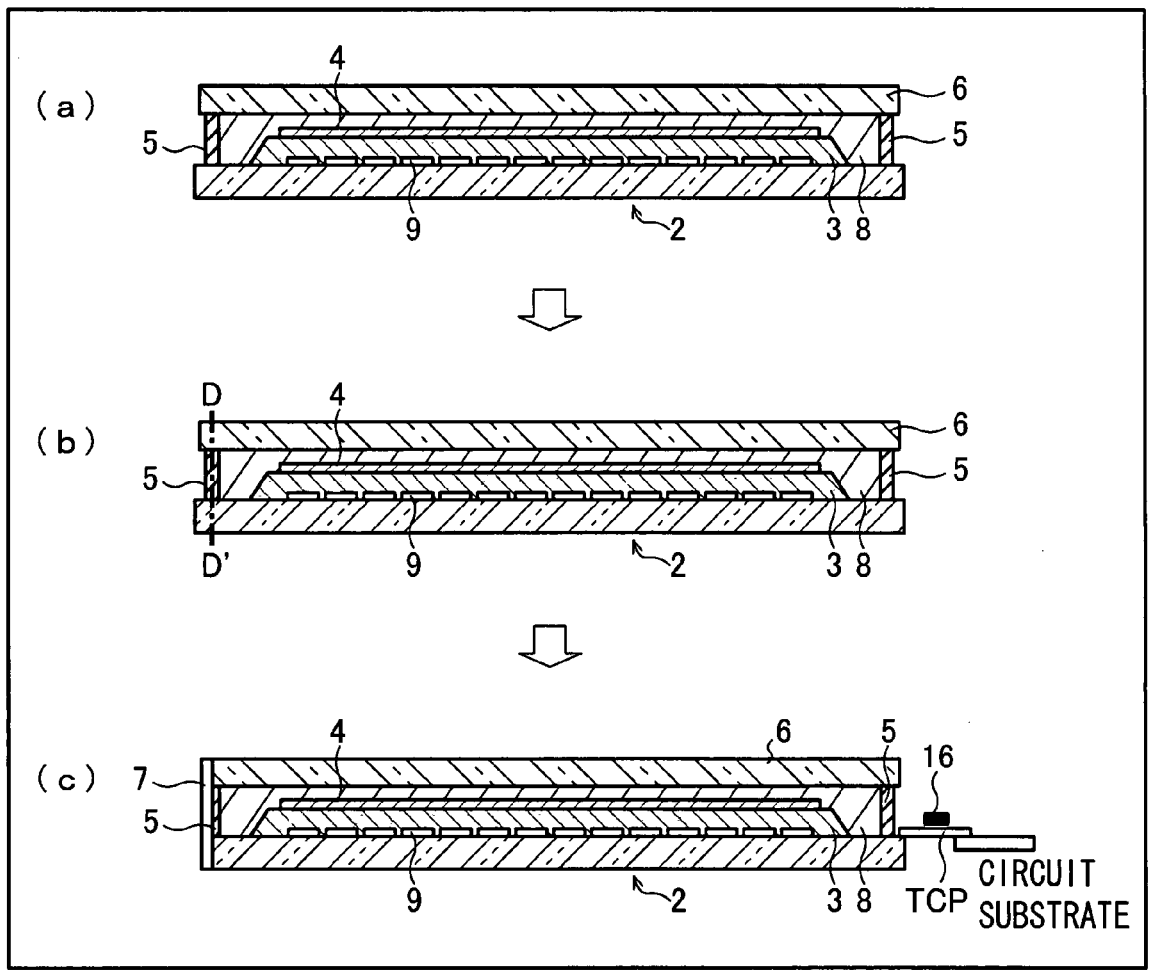
FIG. 11 is cross-sectional views illustrating a radiation detecting apparatus in some steps of manufacturing steps for a radiation detecting apparatus according to Third Embodiment of the present invention.

The following description will discuss yet another embodiment of the present invention with reference to FIGS. 10 and 11. FIG. 10 is a cross-sectional view illustrating a structure of a radiation detecting apparatus 1" of the present embodiment. FIG. 11 illustrates cross-sectional views ((a) through (c)) of the radiation detecting apparatus 1" in manufacturing steps for a radiation detecting apparatus 1" of the present embodiment.

Steps in a method for manufacturing a radiation detecting apparatus 1" of the present embodiment are not shown since they are the same as steps (FIG. 6) in the method for manufacturing a radiation detecting apparatus 1, which has been described in First Embodiment.

In First Embodiment described above, the radiation detecting apparatus 1, as illustrated in FIG. 1, is arranged so that the sealing plate 7 is bonded to cut surfaces of the active matrix substrate 2, the conversion layer 3, the mold structure layer 8, and the counter substrate 6, all of which are flush with each other. On the contrary, the radiation detecting apparatus 1" of the present embodiment is arranged so that a sealing plate 7 is bonded to cut surfaces of an active matrix substrate 2, a spacer material 5, and a counter substrate 6, all of which are flush with each other. In other words, a cutting position in a method for manufacturing the radiation detecting apparatus 1" discussed below is different from that in First Embodiment.

The following description will discuss a method for manufacturing the radiation detecting apparatus 1" of the present embodiment.

As described previously, the radiation detecting apparatus 1" of the present embodiment is manufactured through the steps that are the same as the steps (FIG. 6) in a method for manufacturing the radiation detecting apparatus 1, discussed in First Embodiment. The present embodiment and First Embodiment are different in a cutting position in a cutting step (step S8) illustrated in FIG. 6.

That is, in the radiation detecting apparatus 1" of the present embodiment, a conversion layer 3 is formed so as to cover an image detection area on the active matrix substrate 2 in steps S1 through S3 of FIG. 6, and an upper electrode 4 is formed on the conversion layer 3. Then, in step S4 of FIG. 6, a spacer material and the counter substrate 6 are provided. In step S5 of FIG. 6, a mold resin is filled into a gap between the conversion layer 3, on which surface the upper electrode 4 is formed, the counter substrate 6, and the spacer material 5 to form a mold structure layer. Subsequently, through steps S6 and S7 of FIG. 6, the radiation detecting apparatus 1" as illustrated in (a) of FIG. 11 is formed in which outer edge portions of the active matrix substrate 2 are all wide ends.

Next, the following description will discuss the cutting step (step S8 of FIG. 6) of the radiation detecting apparatus 1" of the present embodiment with reference to (b) of FIG. 11.

In the cutting step of the present embodiment, the active matrix substrate 2, the spacer material 5, and the counter substrate 6 are cut along a cutting line D-D', as illustrated in (b) of FIG. 11, so that their cut surfaces are flush with each other. The cutting step can be carried out by the method described previously.

After the cutting, the cut surfaces are sealed with the sealing plate 7, whereby the radiation detecting apparatus 1" of the present embodiment as illustrated in (c) of FIG. 11 can be manufactured.

Note that as in First Embodiment, the present embodiment has a layout such that the LSI-arranged areas on ends b and c are disposed so as to be displaced toward an end d, as illustrated in FIG. 4. Thus, even if a width of the whole of the LSI-arranged area at one end of mounting ends exceeds a width of an effective area on a photographing side, the LSIs are mounted without problems. In forming an end a (cut end described later) by a cutting operation as described later, the problem occurs if there are leads 30 of a signal line along the cutting line. On the contrary, the layout such that the LSI-arranged areas are disposed so as to be displaced toward the side d, makes it possible to prevent overlap between the leads 30 of the signal line and the cutting line.

As compared with First Embodiment, the radiation detecting apparatus 1" has a slightly larger spacing between the sealing plate 7 (outer edge of the radiation detecting apparatus 1") and the pixel detection area, but the conversion layer 3 is covered with the mold resin layer 8 and the spacer material 5 during the cutting step. In other words, the conversion layer 3 does not become bare after the cutting step. This prevents the conversion layer 3 from being contaminated by air and moisture in the cutting step, thus further enhancing reliability.

Further, since the spacer material is disposed between the counter substrate and the active matrix substrate, the spacer material and a sealing member, which is disposed in the following sealing step, ensures a distance between the counter substrate and the active matrix substrate. This makes it possible to provide a two-dimensional image detecting apparatus without deformation of a mold structure.

The spacer material 5 to be cut is preferably made of a material that is identical (or substantially identical in vulnerability) with a material for the counter substrate 6 and the active matrix substrate 2. Specifically, if the counter substrate 6 and the active matrix substrate 2 are made of glass, it is preferable that the spacer material 5 is made of glass. If the counter substrate 6 and the active matrix substrate 2 are made of resin, it is preferable that the spacer material 5 is made of resin. With this arrangement, it is possible to cut the components (counter substrate 6, spacer material 5, active matrix substrate 2) by dicing or by means of laser under a unify cutting condition, and it is further possible to finely finish the cut surfaces.

Figure 12:
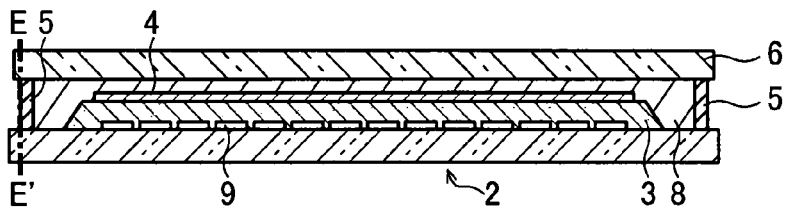
FIG. 12 is a cross-sectional view illustrating another cutting line in the step shown in (b) of FIG. 11 in the manufacturing steps for a radiation detecting apparatus according to Third Embodiment of the present invention.

Note that the cutting line D-D' in the radiation detecting apparatus 1" of the present embodiment is a line at a position indicated in (b) of FIG. 11, although the cutting line is not limited to the line at a position indicated in (b) of FIG. 11. Alternatively, the cutting line D-D' may be a line at a position indicated in FIG. 12 (cutting line E-E') so that the sealing plate 7 (not shown) is provided on cut surfaces after the cutting. However, the cutting line D-D' is preferably a line at the position indicated in (b) of FIG. 11, whereby a distance between the pixel detection area of the active matrix substrate 2 and the outer end (cut end; end a) of the radiation detecting apparatus 1" becomes short.

Note that the spacer material used in the present invention, which is not limited to the above arrangement, may be a spacer material which has a partially thin portion. Specifically, the partially thin portion is disposed at a position corresponding to the cutting line E-E' of FIG. 12, whereby a distance between the pixel detection area of the active matrix substrate 2 and the outer end (cut end; end a) of the radiation detecting apparatus 1" becomes short even if cutting is carried out along the cutting line E-E'.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

A two-dimensional image detecting apparatus of the present invention is a flat panel apparatus and is capable of providing image information with high resolution. As such, the two-dimensional image detecting apparatus of the present invention is applicable to an X-ray image detecting apparatus (radiation detecting apparatus) which takes X-ray images and also applicable to mammography.

The invention claimed is:

1. A method for manufacturing a two-dimensional image detecting apparatus, comprising:
    a conversion layer formation step of forming a conversion layer on a substrate, which has an image detection area and a non-detection area, so that at least the image detection area is covered with the conversion layer, the image detection area having active elements arranged therein, the non-detection area having no active elements arranged therein, the conversion layer converting incident electromagnetic waves into electric charges;
    a counter substrate disposing step of disposing a spacer material on the non-detection area around the conversion layer, and disposing a counter substrate so as to be opposite to the substrate via the spacer material;
    a mold structure formation step of forming a mold structure in an area surrounded by the conversion layer, the spacer material, and the counter substrate;
    a cutting step of, after the mold structure forming step, cutting the substrate and the counter substrate so that respective cut surfaces thereof are flush with each other in a portion of the non-detection area; and
    a sealing step of securing a sealing member to the respective cut surfaces thereof which are flush with each other.

2. The method according to claim 1, wherein
    the substrate is of rectangular shape and has the image detection area in its center section and the non-detection area around the image detection area, and
    the substrate is cut at its one end in the cutting step.

3. The method according to claim 1, wherein
    in the cutting step, the spacer material is cut so that the respective cut surfaces of the substrate and the counter substrate and a cut surface of the spacer material are flush with each other.

4. The method according to claim 1, wherein
    in the cutting step, the mold structure is cut so that the respective cut surfaces of the substrate and the counter substrate and a cut surface of the mold structure are flush with each other.

5. The method according to claim 1, wherein
    in the cutting step, (i) the mold structure and (ii) a portion of the conversion layer with which the image detection area is not covered are cut so that the respective cut surfaces of the substrate and the counter substrate, a cut surface of the mold structure, and a cut surface of the conversion layer are flush with each other.

6. The method according to claim 2, further comprising:
a mounting step of mounting circuit components, wherein the substrate is cut at its one end in the cutting step, and the circuit components to be mounted in the mounting step are mounted in the non-detection area on two ends of the substrate which are adjacent to the one end, so that the circuit components are located away from the one end.

7. The method according to claim 1, wherein the spacer material is identical in vulnerability with the substrate and the counter substrate.

8. The method according to claim 1, wherein the mold structure is made of a material having insulation properties.

* * * * *